US008659163B2

(12) United States Patent
Park et al.

(10) Patent No.: US 8,659,163 B2
(45) Date of Patent: Feb. 25, 2014

(54) SEMICONDUCTOR DEVICE HAVING THROUGH ELECTRODE AND METHOD OF FABRICATING THE SAME

(71) Applicant: Samsung Electronics Co., Ltd., Suwon-si (KR)

(72) Inventors: Ki-Tae Park, Seongnam-si (KR); Kang-Wook Lee, Suwon-si (KR); Hyun-Kyoung Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/621,314

(22) Filed: Sep. 17, 2012

(65) Prior Publication Data

US 2013/0015588 A1  Jan. 17, 2013

Related U.S. Application Data

(62) Division of application No. 12/270,386, filed on Nov. 13, 2008, now Pat. No. 8,288,278.

(30) Foreign Application Priority Data

Nov. 14, 2007 (KR) .......................... 10-2007-0116070

(51) Int. Cl.
*H01L 23/48* (2006.01)
*H01L 23/52* (2006.01)
*H01L 29/40* (2006.01)

(52) U.S. Cl.
USPC .......................................................... 257/774

(58) Field of Classification Search
USPC .......................................................... 257/774
See application file for complete search history.

(56) References Cited

U.S. PATENT DOCUMENTS

| | | | |
|---|---|---|---|
| 5,846,879 A | 12/1998 | Winnerl et al. | |
| 6,707,157 B2 * | 3/2004 | Hoshino | 257/773 |
| 6,841,883 B1 | 1/2005 | Farnworth et al. | |
| 6,897,148 B2 | 5/2005 | Halahan et al. | |
| 7,276,799 B2 | 10/2007 | Lee et al. | |
| 7,338,896 B2 * | 3/2008 | Vanhaelemeersch et al. | 438/638 |
| 7,414,278 B2 * | 8/2008 | Sugatani et al. | 257/296 |
| 7,816,227 B2 * | 10/2010 | Chen et al. | 438/424 |
| 7,843,068 B2 | 11/2010 | Murayama et al. | |
| 7,892,973 B2 * | 2/2011 | Kawano et al. | 438/667 |
| 7,923,369 B2 * | 4/2011 | Smith | 438/667 |
| 7,968,460 B2 * | 6/2011 | Kirby et al. | 438/667 |
| 7,985,655 B2 * | 7/2011 | Smith | 438/424 |
| 8,227,902 B2 * | 7/2012 | Kuo | 257/659 |
| 8,404,587 B2 * | 3/2013 | Kirby et al. | 438/667 |
| 2002/0109236 A1 | 8/2002 | Kim et al. | |
| 2003/0151144 A1 * | 8/2003 | Muta et al. | 257/774 |

(Continued)

FOREIGN PATENT DOCUMENTS

| | | |
|---|---|---|
| JP | 2004-342990 | 12/2004 |
| KR | 1020020012061 A | 2/2002 |
| KR | 100617941 B1 | 8/2006 |

*Primary Examiner* — Jae Lee
*Assistant Examiner* — Grant Withers
(74) *Attorney, Agent, or Firm* — Volentine & Whitt, PLLC

(57) ABSTRACT

A semiconductor device includes a substrate, and a through electrode passing through the substrate. The semiconductor device has a pad region and a through electrode region. A pad covers the pad region, extends into the through electrode region, and delimits an opening in the through electrode region. A through electrode extends through the semiconductor substrate below the hole in the pad in the through region.

20 Claims, 9 Drawing Sheets

(56) References Cited

U.S. PATENT DOCUMENTS

| | | |
|---|---|---|
| 2004/0048459 A1 | 3/2004 | Patti |
| 2005/0029630 A1 | 2/2005 | Matsuo |
| 2005/0046034 A1* | 3/2005 | Farrar ............................ 257/777 |
| 2006/0022242 A1* | 2/2006 | Sugatani et al. ............... 257/296 |
| 2006/0043535 A1 | 3/2006 | Hiatt |
| 2006/0205211 A1 | 9/2006 | Kirby |
| 2006/0223301 A1* | 10/2006 | Vanhaelemeersch et al. 438/618 |
| 2007/0001312 A1 | 1/2007 | Murayama et al. |
| 2007/0048973 A1 | 3/2007 | Koizumi et al. |
| 2007/0063240 A1* | 3/2007 | Torres et al. ................... 257/296 |
| 2007/0184654 A1 | 8/2007 | Akram et al. |
| 2007/0275514 A1* | 11/2007 | Itou ................................. 438/151 |
| 2008/0164573 A1* | 7/2008 | Basker et al. .................. 257/621 |
| 2008/0283959 A1* | 11/2008 | Chen et al. ..................... 257/508 |
| 2009/0008790 A1* | 1/2009 | Lee et al. ........................ 257/774 |
| 2009/0191708 A1* | 7/2009 | Kropewnicki et al. ......... 438/667 |
| 2009/0315154 A1* | 12/2009 | Kirby et al. ..................... 257/621 |
| 2011/0034027 A1* | 2/2011 | Kuo et al. ....................... 438/667 |
| 2013/0015504 A1* | 1/2013 | Kuo et al. ....................... 257/213 |
| 2013/0187287 A1* | 7/2013 | Park et al. ...................... 257/774 |

* cited by examiner

SEMICONDUCTOR DEVICE HAVING THROUGH ELECTRODE AND METHOD OF FABRICATING THE SAME

CROSS-REFERENCE TO RELATED APPLICATIONS

This application is a divisional of application Ser. No. 12/270,386, filed Nov. 13, 2008, which is incorporated herein by reference in its entirety.

BACKGROUND OF THE INVENTION

1. Field of the Invention

The present invention relates to a semiconductor device and to a method of fabricating the same. More particularly, the present invention relates to a semiconductor device having a through electrode and to a method of fabricating the same.

2. Description of the Related Art

Recently, segments of the electronics industry have focused on the manufacturing of lightweight and compact products which have fast response time, multi-functionality, high performance and high reliability and yet which can be fabricated at a low cost. One of the important approaches in realizing such products revolves around the design of semiconductor device packages. Known packages include those having a through electrode, i.e., an electrode which passes through a substrate in which the electrode is formed.

SUMMARY OF THE INVENTION

An object of the invention is to provide an efficient method of manufacturing a semiconductor device having a through electrode.

Another object of the present invention is to provide a semiconductor device that has a through electrode and which offers high performance at the point of the through electrode.

Yet another object of the present invention is to provide a semiconductor device that has a through electrode, and a pad that is electrically conductively connected to the through electrode and yet can readily serve as a test probe pad or a wire bonding pad.

According to one aspect of the present invention, there is provided a semiconductor device having a through electrode and a (metal) pad, and in which the pad occupies a pad region and a portion of a through electrode region of the device, and wherein only an active region of the substrate is present within the through electrode region. The pad may consist of a single patterned layer of conductive material or may have a multi-layered structure. An isolation layer demarcates the active region and is thus not present in the through electrode region. The pad delimits an opening therethrough in the through electrode region. The through electrode passes through the semiconductor substrate under the opening.

A first insulating layer may be interposed between the pad and the semiconductor substrate. In the case in which the pad has a multi-layered structure, a second insulating layer is interposed between patterned layers constituting the pad. Also, a via in the second insulating layer may contact the patterned layers constituting the pad so as to electrically conductively connect the patterned layers.

Preferably, a third insulating layer is interposed between the through electrode and the semiconductor substrate. Also, a barrier metal layer may be interposed between the through electrode and the third insulating layer.

The semiconductor device may also have an interconnection pattern disposed in contact with and electrically conductively connecting the through electrode and the pad.

According to another aspect of the invention, the pad has opposite sides, the opening is located closer to one side of the pad than the other, and the pad presents a larger surface area in the pad region than in the through electrode region. Preferably, the through electrode region and the pad region are adjacent to each other. The through electrode region and the pad region may be disposed side-by-side. Alternatively, the through electrode region is located in the midst of the pad region. In another embodiment, the through electrode region is spaced apart from the pad region, and the pad has a necked in section extending between the pad region and the through electrode region.

According to another aspect of the invention, there is provided a method of fabricating a semiconductor device having a through electrode, and a pad, wherein the patterning of a layer to form the pad and the forming of a gap through the pad are performed simultaneously. First, a semiconductor substrate having an active region is provided. Preferably, an isolation layer is formed in the semiconductor substrate to demarcate the active region of the substrate. At least one electrically conductive (metal) pad layer is then formed on the substrate.

Next, each electrically conductive pad layer is patterned to form a pad on the semiconductor substrate in a pad region and in at least a portion of a through electrode region. The pad region encompasses part of the active region. At the same time, a gap through the pad layer is formed in the through electrode region. The pad thus delimits an opening in the through electrode region, i.e., the opening is constituted by the gap(s) in the conductive pad layer(s).

Then, a hole is formed in the semiconductor substrate under the opening in the through electrode region. A through electrode is formed in the hole. The through electrode fills the hole. Subsequently, the back of the semiconductor substrate is polished until a lower portion of the through electrode is exposed. As a result, the through electrode passes through the substrate.

A first insulating layer may be formed on the semiconductor substrate before the pad.

Also, the pad pattern may be formed as a multi-layered structure. In such an embodiment, a first electrically conductive (metal) layer is formed on the semiconductor substrate, the first electrically conductive (metal) layer is patterned to form a first patterned pad layer which covers the pad region and extends into the through electrode region while at the same time a first gap is formed through the first electrically conductive (metal) layer in the through electrode region. Next, a second insulating layer is formed on the semiconductor substrate over the first patterned pad layer. Then, a second electrically conductive (metal) layer is formed on the semiconductor substrate over the second insulating layer. The second electrically conductive (metal) layer is patterned to form a second patterned pad layer which covers the pad region, and extends into the through electrode region. At the same time, a second gap aligned with the first opening is formed through the second electrically conductive (metal) layer in the through electrode region. A via may be formed in the second insulating layer so as to electrically conductively connect the second patterned pad layer and the first patterned pad layer.

A hole is then formed in the substrate in the through electrode region. The hole is preferably formed in the substrate by dry etching.

Also, an insulating layer may be formed on an inner wall surface, defining at least the side of the hole, before the through electrode is formed. Thus, the insulating layer is interposed between the substrate and the through electrode once the through electrode has been formed. In this case, a barrier metal layer is preferably formed on the third insulating layer so as to be interposed between the insulating later and the through electrode once the through electrode is formed.

In addition, an interconnection pattern electrically that contacts and electrically conductively connects the through electrode and the pad is formed over the through electrode. In this respect, first, an interlayer insulating layer is formed on the substrate including over the through electrode. The interlayer insulating layer is then patterned to form a first via hole exposing the through electrode and a second via hole exposing the pad. Next, an interconnection layer of electrically conductive material is formed on the substrate to fill the first and second via holes. Finally, the interconnection layer is patterned.

BRIEF DESCRIPTION OF THE DRAWINGS

The foregoing and other objects, features and advantages of the invention will become more apparent from the following detailed description of preferred embodiments of the invention made with reference to the accompanying drawings. The drawings are not necessarily to scale. Instead, emphasis in the drawings is placed upon illustrating the principles of the invention.

DETAILED DESCRIPTION OF THE PREFERRED EMBODIMENTS

Figure 1:
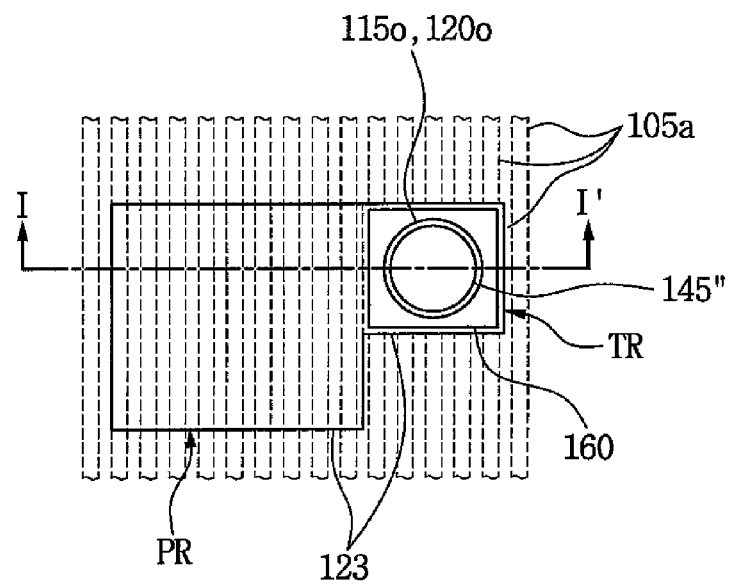
FIG. 1 is a plan view of an embodiment a semiconductor device according the present invention.

The present invention will be described more fully hereinafter with reference to the accompanying drawings. In the drawings, the relative thicknesses of layers and regions are exaggerated for clarity. Also, like numbers designate like elements throughout the drawings. In addition, when a layer is described as being disposed/formed on another layer or substrate, such a description includes the case in which the layer is disposed/formed directly on the other layer or substrate, as well as the case in which a third layer or layers is/are interposed between the layer and the other layer or substrate.

Semiconductor devices and methods of forming the same according to the present invention will now be described with reference to FIGS. 1, and 2A to 2F. Note, these figures illustrate only part of a semiconductor chip that will be assembled into a package for use in an electronic product.

Figure 2A:
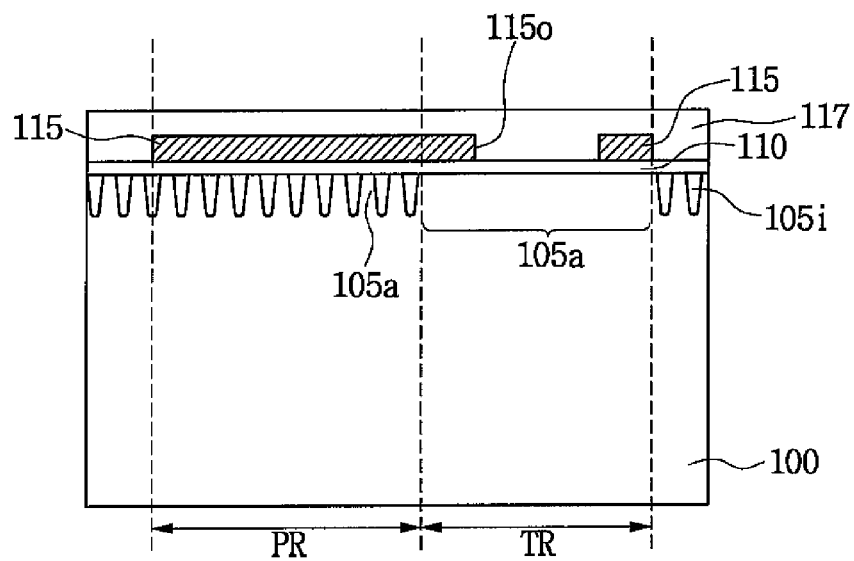
FIGS. 2A to 2F are each a cross-sectional view, taken in the direction of line I-I' of FIG. 1, and together illustrate a sequence in a method of manufacturing the semiconductor device according to the present invention.

Referring first to FIGS. 1 and 2A, the semiconductor chip includes a semiconductor substrate 100 on which an integrated circuit (not shown) has been formed. More specifically, numerous integrated circuits are formed on a wafer, the integrated circuits and wafer constitute several semiconductor chips, and a scribe line region on the wafer delimits the semiconductor chips. The wafer is eventually cut along the scribe line region to separate the chips from one another. This wafer fabrication process is known per se. Also, the integrated circuit of the semiconductor chip is not a key element to understanding the present invention. Therefore, the integrated circuit of the chip is shown in the accompanying drawings and will not be described in an further detail.

Figure 4A:
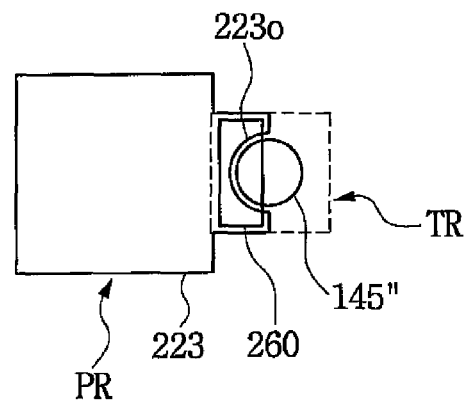
FIGS. 4A to 4C are plan views of other embodiments of semiconductor devices according to of the present invention, respectively.
Figure 4B:
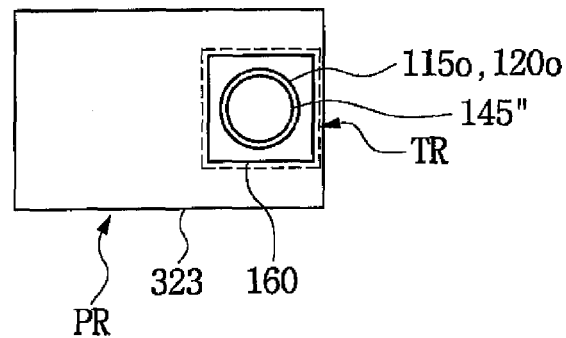
Figure 4C:
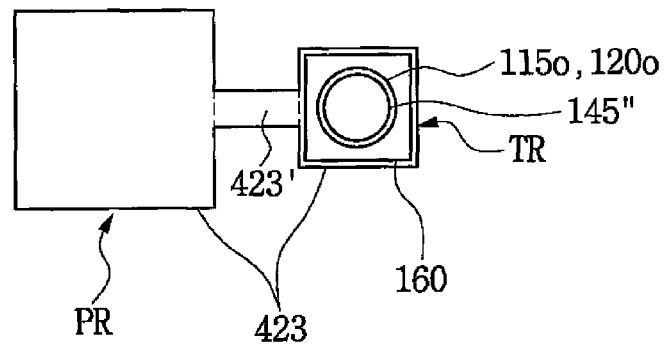

Referring back to FIGS. 1 and 2A, the semiconductor chip has a pad region PR and a through electrode region TR. In this embodiment, the through electrode region TR and pad region PR are adjacent to each other as disposed side-by-side. However, the present invention is not so limited. For example, as shown in FIG. 4B, the through electrode region TR may be located in the pad region PR. Alternatively, as illustrated in FIG. 4C, the through electrode region TR may be spaced from the pad region PR.

An isolation layer 105i is formed in the upper surface of the semiconductor substrate 100 of the chip. The isolation layer 105i may be a trench isolation layer. The isolation layer 105i defines an active region 105a in the semiconductor substrate 100. Part of the active region extends throughout the entire through electrode region TR. That is, the isolation layer 105i does not reside in any part of the through electrode region TR.

A first insulating layer 110 is formed on the substrate having the isolation layer 105i. Also, a first pad layer is then formed over the first insulating layer 110. The first pad layer may be a layer comprising Al or Cu. Subsequently, the first pad layer is patterned so as to form a first pad pattern layer (or simply "pad") 115. The first pad pattern layer 115 covers the pad region PR and extends to and into the through electrode region TR. Also, the first pad pattern layer 115 has a first opening 115o in the through electrode region TR. A second insulating layer 117 is then formed over the first pad pattern layer 115.

Note, with respect to the forming of the structure shown in FIG. 2A, an insulating layer (not shown) may be formed on the semiconductor substrate 100 before the first insulating layer 110 is formed. Then a polysilicon pattern (also not shown) may be formed on the insulating layer. In this case, the first insulating layer 110a is formed on the polysilicon pattern, and a via is formed in the first insulating layer 110 as extending to the polysilicon pattern. The first pad pattern layer 115 is electrically conductively connected to the polysilicon pattern by means of the via.

Figure 2B:
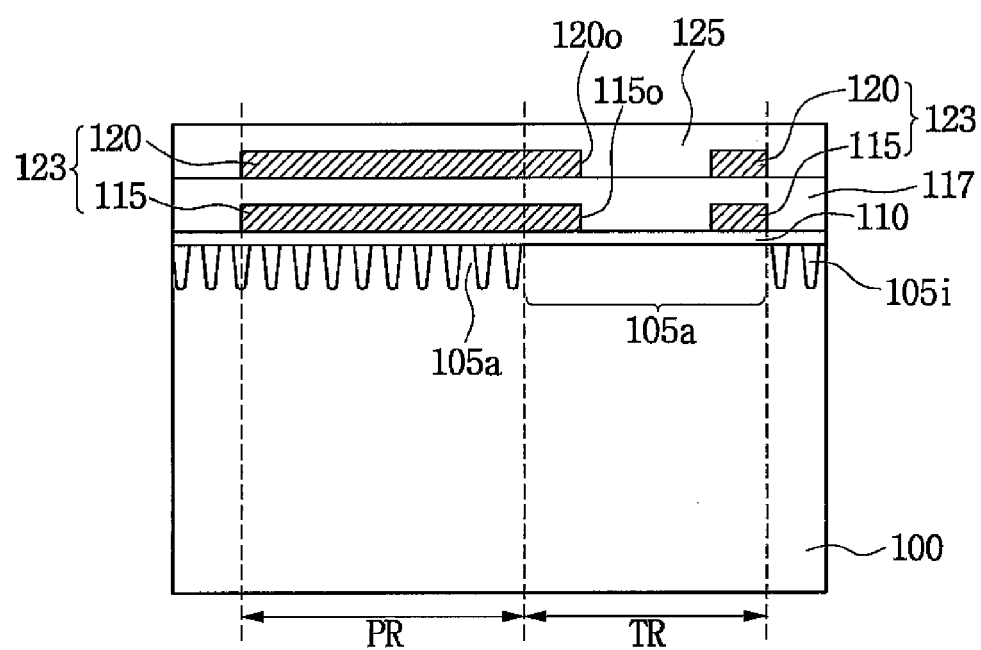

Referring to FIGS. 1 and 2B, a second pad layer is formed over the second insulating layer 117 on the substrate 100. Subsequently, the second pad layer is patterned so as to form a second pad pattern layer 120 aligned with the first pad pattern layer 115. That is, the second pad pattern layer 120 covers the pad region PR, extends to and into the through electrode region TR, and has a second opening 120o located over the first opening 115o in the through electrode region TR. The first and second pad pattern layers 115 and 120 may be electrically conductively connected to each other by a via (not illustrated) that extends through the second insulating layer 117. At least one additional pad pattern layer may be formed on the second pad pattern 120, and may be electrically conductively connected to an underlying pad pattern layer by a via.

The first and second pad pattern layers 115 and 120 may together constitute a pad 123. That is, the pad 123 may be a multi-layered structure. The pad 123, as illustrated in FIG. 1, is inscribed in the electrode region TR, i.e., extends within and contiguously along the entire perimeter of the electrode region TR. Alternatively, as illustrated in FIG. 4A, a pad 223 may extend within the perimeter of the through electrode region TR but along only part of the perimeter of the through electrode region TR. In this case, the opening 223o delimited by the pad pattern 223 is semicircular. Alternatively, as in the embodiment of FIG. 4B, in which the through electrode region TR is disposed in the pad region PR, the pad 323 extends along the entire perimeter of the through electrode region TR. In the embodiment of FIG. 4C in which the pad region PR and the through electrode region TR are spaced apart from each other, the pad 423 has a section covering the pad region PR, a section extending within and contiguously along the entire perimeter of the through electrode region TR, and a pad extension section 423' connecting the sections of the pad pattern in the pad region PR and though electrode region TR. The pad extension section 423' is a neck in the pad 423. That is, the pad extension section 423' is narrower than each of the sections of the pad in the pad region PR and though electrode region TR.

Referring to FIGS. 1 and 2B, a mask layer 125 is subsequently formed over the pad 123 on the substrate 100. The mask layer 125 may be an insulating layer.

Figure 2C:
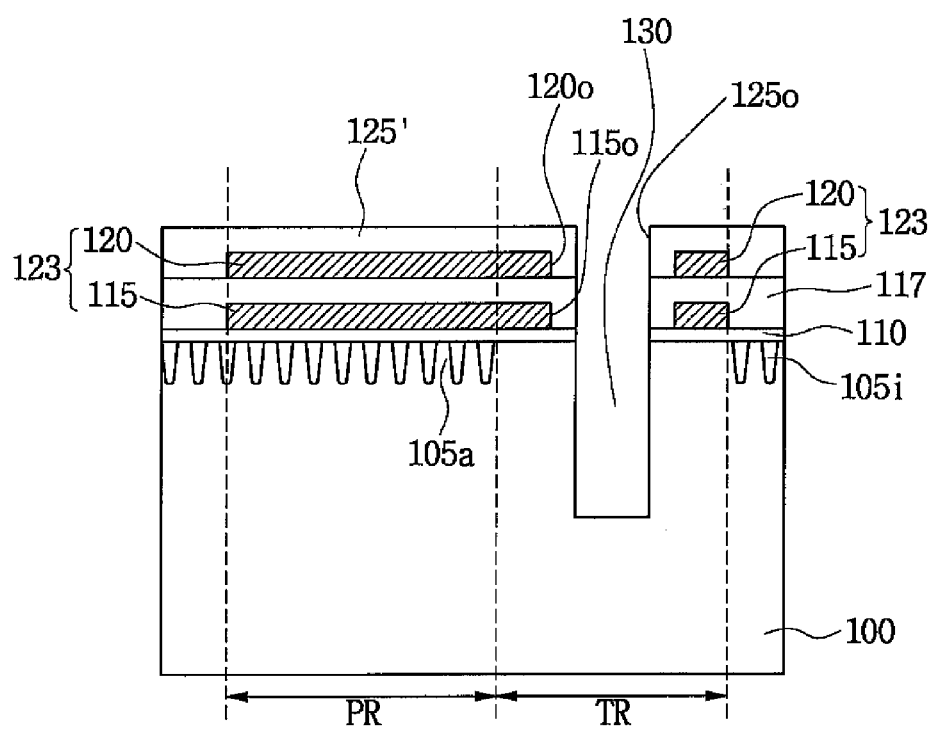

Referring to FIGS. 1 and 2C, the mask layer 125 is patterned so as to form a mask pattern 125' having an opening 125o. The first and second insulating layers 110 and 117 are then etched using the mask pattern 125' as an etching mask. The etching process of forming the hole 130 may be a laser etching (drilling), a wet etching or a dry etching process. A deeper hole, though, can be formed by laser etching (drilling) than by dry etching. In any case, as a result, a hole 130 is formed through the insulating layers 110 and 117 and in the substrate 100. The etching process is carried out until the depth of the hole 130 allows the hole 130 to be exposed by a back-side polishing process, namely, a process in which the back-side of the wafer is polished (to be described in more detail later on). The back side of the wafer corresponds to the bottom surface of the substrate 100 in the figures.

In the present embodiment, the hole 130 is formed by dry etching. As was described above, the through electrode region TR is not occupied by any portion of the isolation layer 105i. For this reason, the hole 130 may be formed using only one etching process, e.g., a dry etching process using an etching gas capable of etching away only the material of the semiconductor substrate. Thus, the hole 130 can be formed extremely efficiently.

Figure 2D:
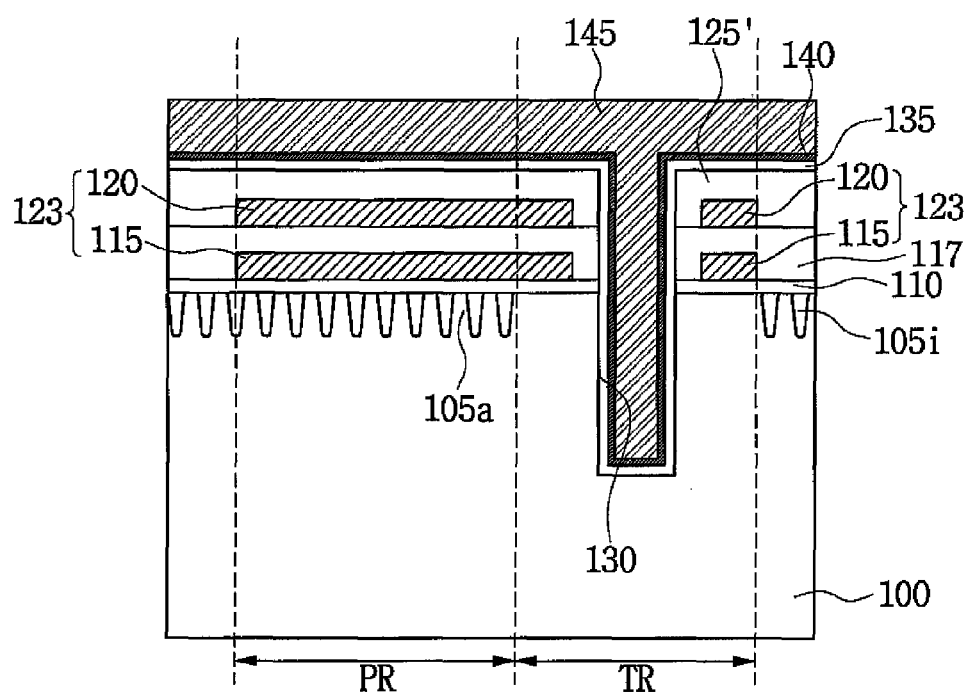

Referring to FIGS. 1 and 2D, a third insulating layer 135 is formed on the substrate 100 including within the hole 130. The third insulating layer 135 may be an oxide layer, a nitride layer or a combination thereof. The third insulating layer 135 prevents an electrical short which could otherwise be caused by contact between the conductive material which will fills the hole 130 (formed during a subsequent step) and a surface defining the hole 130. In the illustrated embodiment, the third insulating layer 135 is formed over the surfaces which define the side and bottom of the hole 130, respectively. However, the third insulating layer 135 may be formed only on the surface which defines the side of the hole 130. The third insulating layer 135 does not have to be formed on the surface of the semiconductor substrate 100 defining the bottom of the hole 130 because the bottom of the semiconductor substrate 100 will be removed after the hole 130 and third insulating layer 135 are formed.

Subsequently, a barrier metal layer 140 is formed on the substrate over the third insulating layer 135. The barrier metal layer 140 may be formed by sputtering. The barrier metal layer 140 is formed of a metal having good adhesive strength with respect to the third insulating layer 135 and good wettability with respect to welding. Materials having good adhesive strength with respect to the third insulating layer 135, when the third insulating layer is an oxide layer and/or a nitride layer, include chromium (Cr) and titanium (Ti). Materials having good wettability with respect to welding include silver (Ag), gold (Au), copper (Cu), nickel (Ni), palladium (Pd) and platinum (Pt). Accordingly, the barrier metal layer 140 is preferably formed of a Ti/Cu, Ti/Pd, Ti/Pt, Ti/Ni, or Cr/Cu alloy or a combination thereof.

A metal layer 145 is formed on the substrate over the barrier metal layer 140 so as to fill the hole 130. The metal layer 145 may be formed by plating. The metal layer 145 may be formed of a single metal or an alloy thereof which has good wettability with respect to welding. For example, the metal layer 145 may consist of a material selected from the group consisting of Ag, Au Cu, Ni, Pd, Pt, Sn, In, Ti, W, Ta and Al, or may be an alloy of at least two materials selected from the group.

Figure 2E:
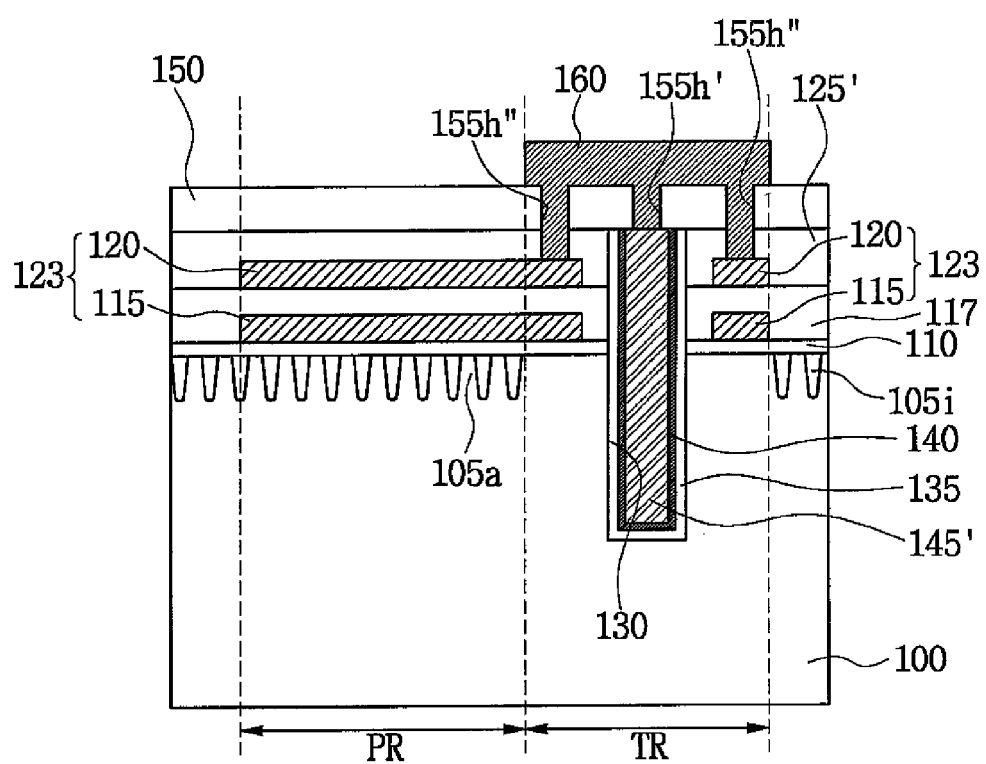

Referring to FIGS. 1 and 2E, the metal layer 145 is planarized until the mask pattern 125' is exposed. Thus, at the same time, the barrier metal layer 140 on the mask pattern 125' is removed. Furthermore, the third insulating layer 135 on the mask pattern 125' may or may not be removed during the planarization process. As a result, a metal stem 145', i.e., a vertically extending cylinder of metal, fills the hole 130.

Subsequently, an interlayer insulating layer 150 is formed on the substrate. The interlayer insulating layer 150 is patterned to form a first via hole 155h' exposing a predetermined region of the metal stem 145', and second via holes 155h" exposing predetermined regions of the pad pattern 123. The second via holes 155h" may surround the metal stem 145'.

An interconnection layer filling the first and second via holes 155h' and 155h" is then formed on the substrate so as to be buried within the first and second via holes 155h' and 155h". The interconnection layer is then patterned to form an interconnection pattern 160 filling the first and second via holes 155h' and 155h" and electrically conductively connecting the metal stem 145' and the pad pattern 123.

Alternatively, contact plugs may be formed in the first and second via holes 155h' and 155h", respectively. Then, an interconnection pattern is formed directly on the first and second contact plugs. That is, the contact plugs and interconnection pattern are formed separately from each other by respective processes.

The interconnection pattern 160, as illustrated in FIGS. 1, 4B and 4C, is confined within and occupies the entire through electrode region TR, thereby covering the entire portion of the pad pattern in the through electrode region TR. In the embodiment of FIG. 4A, the interconnection pattern 260 is confined within but occupies only part of the through electrode region TR, and yet still covers the entire portion of the pad pattern 223 in the through electrode region TR. Alternatively, though, part of the interconnection pattern may extend beyond the through electrode region TR, i.e., into the pad region PR.

Figure 2F:
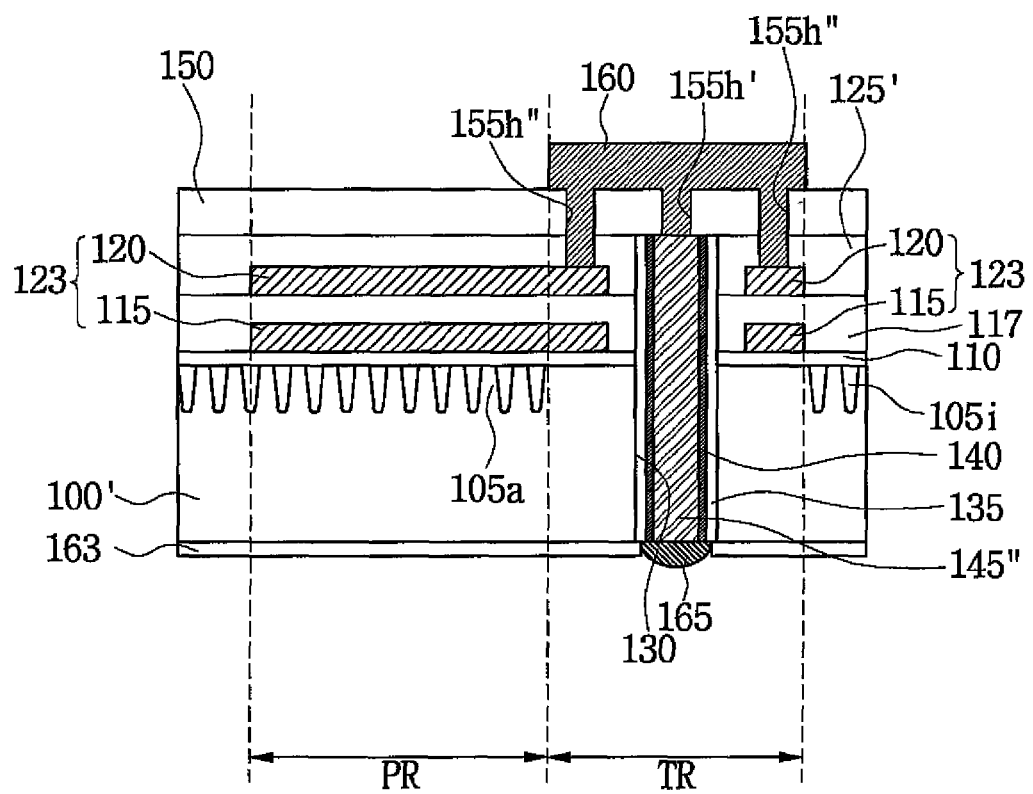

Referring to FIGS. 1 and 2F, the semiconductor substrate 100, i.e., the back side of the wafer is polished. In particular, the back of the semiconductor substrate 100 may be polished with a grinder to realize a thin chip-scale package and expose a lower portion of the metal stem 145' through the back side of the semiconductor substrate 100. For example, the wafer has a thickness of about 500 to 700 μm before it is polished, and has a thickness of about 100 μm or less after the back side of the wafer is polished. The present invention is not so limited, though. Certain applications may allow for the semiconductor substrate 100 to be even thinner.

As mentioned above, the lower portion of the metal stem 145' is exposed at the back of the semiconductor substrate 100 by the back-side polishing process. Thus, a through electrode 145" passing through the semiconductor substrate 100 is formed. Subsequently, a fourth insulating layer 163 is formed on the back of the semiconductor substrate 100. After that, the fourth insulating layer 163 is patterned so as to expose the lower portion of the through electrode 145". Then, a bump 165 is formed on the lower portion of the through electrode 145" exposed at the back of the semiconductor substrate 100.

Figure 3:
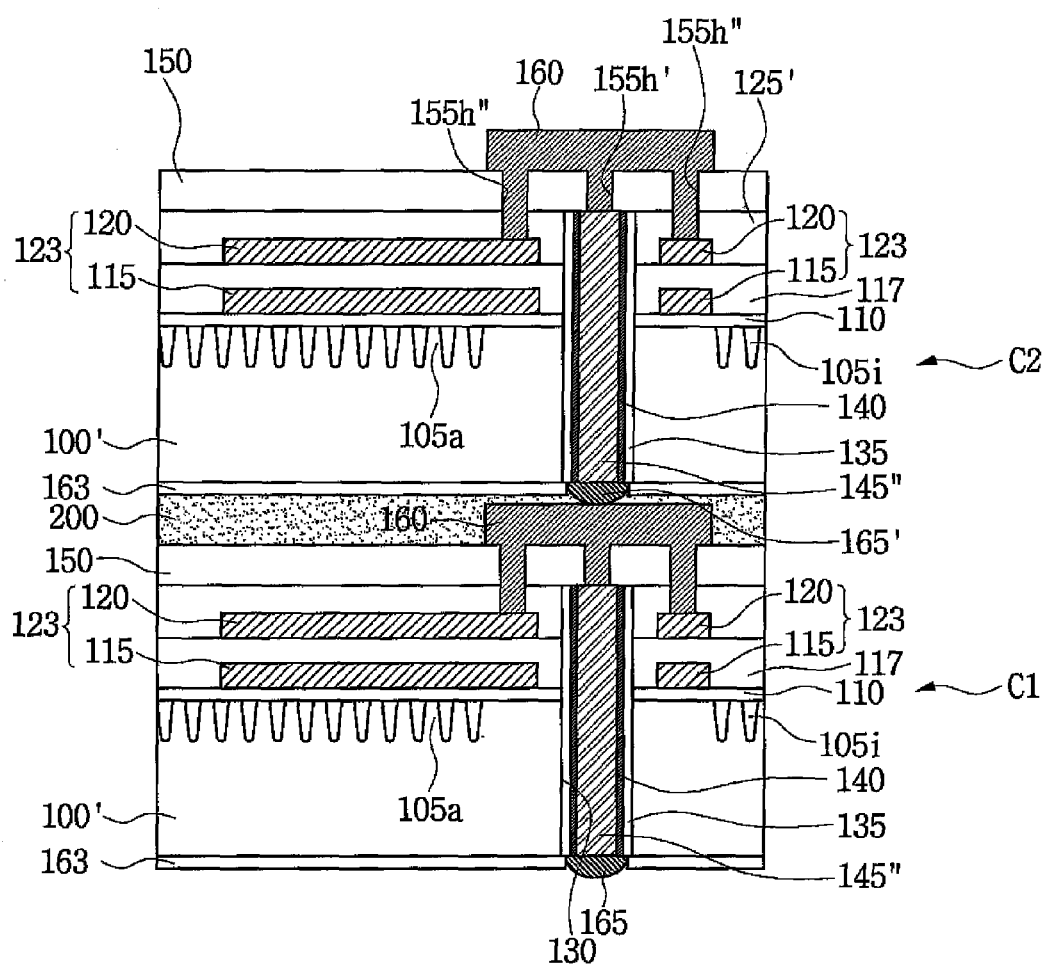
FIG. 3 is a cross-sectional view of a stacked type of chip package according to the present invention.

A stacked type of chip package and a method of fabricating the same will now be described with reference to FIG. 3.

The stacked type of chip package is one in which chips (semiconductor devices) chips according to the present invention are integrated. That is, the chip package includes an upper chip C2 and a lower chip C1, each formed by the method described with reference to FIGS. 1 and 2A to 2F. Then, (the through electrodes of) the lower chip C1 and the upper chip C2 are aligned (vertically), and a bump 165' of the upper chip C2 and an interconnection pattern 160 of the lower chip C1 are placed in contact. Thus, (the integrated circuits of) the chips C1 and C2 are electrically conductively connected by the through electrodes. Then, an empty space between the lower chip C1 and the upper chip C2 is filled with resin 200 by a molding process. Also, according to the present invention, at least one other chip may be interposed between the lower chip C1 and the upper chip C2. In this case, adjacent chips in the stack are connected as shown in FIG. 3 so that all of the chips in the stack are electrically conductively connected by the through electrodes.

Figure 5:
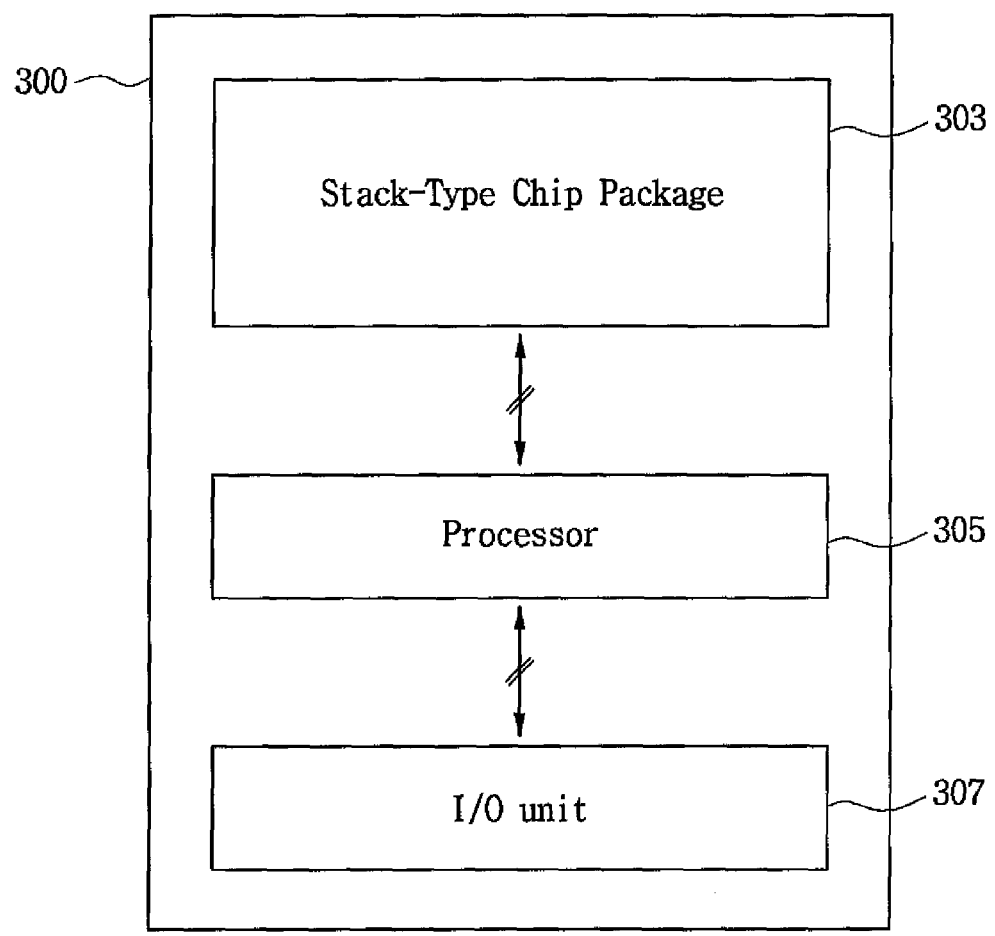
FIG. 5 is a schematic block diagram of an electronic system having a stacked type of chip package according to the present invention.

FIG. 5 schematically illustrates an electronic system 300 having a stacked type of chip package, according to the present invention.

Referring to FIG. 5, the electronic system 300 includes at least one stacked type of chip package 303 and a processor 305 which contacts the chip package 303. In this system, the stacked type of chip package 303 is of the type described with reference to FIG. 3. For example, the chip package 303 includes a lower chip C1 attached to an upper chip C2 by resin 200.

The electronic system 300 may comprise the core of a notebook computer, a digital camera, an MP3 player or a mobile phone. In this case, the processor 305 and the chip package 303 are mounted on a board, and the chip package 303 serves as a data storage device for the processor 305.

The electronic system 300 also includes an input/output unit 307 by which the system can exchange data with another electronic system such as a personal computer or a computer network. For example, the input/output unit 307 may be configured to transmit data to a peripheral bus line of a computer, a high-speed digital transmission line or a wireless transceiver antenna. Data communications between the processor 305 and the chip package 303 and between the processor 305 and the input/output unit 307 may be carried out using common bus architecture.

As described above, in a method of fabricating a semiconductor device according to the present invention, an opening that facilitates the forming of a through electrode is formed in a pad layer, i.e., in a through electrode region, when the pad layer is otherwise patterned outside the through electrode region (e.g., over ICs on the substrate). Thus, the present invention obviates the need for an additional (exclusive) mask and etching process to form an opening in the pad layer in the through electrode region.

Furthermore, only an active region of the substrate, i.e., a region without an isolation layer, is located within the through electrode region. Therefore, a dry etching process for forming a hole in the semiconductor substrate, in which hole the through electrode is formed, only has to employ an etching gas capable of etching away the material of the semiconductor substrate. Thus, the hole can be formed relatively quickly and economically, i.e., through only a single etch process. That is, the present invention can enhance the productivity of the overall semiconductor device manufacturing process, and help keep production costs down.

Furthermore, according to embodiments of the present invention, the pad region is discrete from but adjacent to the through electrode region. Therefore, the path along which the pad is electrically conductively connected to the through electrode is relatively short. Thus, this feature contributes to an enhanced performance of the semiconductor device. In addition, the pad may thus present a relatively large surface area by locating the opening in the pad closer to one side than of the pad than the other, regardless of whether the through electrode region and pad region are disposed side-by-side, whether the through electrode region is disposed in the midst of the pad region, or whether the pad region and the through electrode region are spaced from one another. Thus, the pad can readily serve as a test probe pad or a wire bonding pad.

Although the present invention has been described above in connection with the preferred embodiments thereof, the present invention is not so limited. Rather, various changes to and modifications of the preferred embodiments will be readily apparent to those of ordinary skill in the art. Thus, the true spirit and scope of the present invention is not limited to the embodiments as described above but by the following claims.

What is claimed is:

1. A semiconductor device, comprising:
a semiconductor substrate;
an isolation layer of electrically insulating material in an upper portion of the semiconductor substrate;
at least one pad layer disposed on the semiconductor substrate,
wherein the semiconductor device has a pad region where part of the isolation layer resides, and a through electrode region where no portion of the isolation layer exists,
each said at least one pad layer is a contiguous layer of electrically conductive material,
each said at least one pad layer covers the entirety of the isolation layer in the pad region,
each said at least one pad layer extends to and along the perimeter of the through electrode region, each said at least one pad layer has an opening therethrough in the through electrode region, and
the at least one pad layer constitutes an electrically conductive pad of the device; and
a through electrode at least part of which passes through the semiconductor substrate in the through electrode region directly under the opening.

2. The semiconductor device according to claim 1, further comprising:
a first insulating layer disposed between the pad and the semiconductor substrate.

3. The semiconductor device according to claim 1, wherein the at least one pad layer comprises a plurality of vertically spaced apart patterned pad layers disposed one above the other, and each of the pad layers is a contiguous layer of conductive material.

4. The semiconductor device according to claim 3, further comprising:
a second insulating layer disposed between the patterned pad layers; and
a via passing through the second insulating layer and electrically conductively connecting the patterned pad layers.

5. The semiconductor device according to claim 1, further comprising:
   an insulating layer interposed between the through electrode and the semiconductor substrate.

6. The semiconductor device according to claim 5, further comprising:
   a barrier metal layer interposed between the through electrode and the insulating layer.

7. The semiconductor device according to claim 1, further comprising:
   an interconnection pattern of electrically conductive material contacting and connecting the through electrode and the electrically conductive pad.

8. The semiconductor device according to claim 1, wherein the electrically conductive pad has opposite sides in the first direction, the opening is located closer to one of said opposite sides of the electrically conductive pad than the other, and each said at least one pad layer has an upper surface whose area is greater in the pad region than in the through electrode region.

9. The semiconductor device according to claim 8, wherein the through electrode region and the pad region are adjacent to each other and do not overlap each other.

10. The semiconductor device according to claim 8, wherein the through electrode region is located in the midst of surrounded by the pad region.

11. The semiconductor device according to claim 8, wherein the through electrode region is spaced apart from the pad region, and each said at least one pad layer has a necked in section, as viewed in plan, extending between the pad region and the through electrode region.

12. The semiconductor device according to claim 1, where the isolation layer comprises linear segments of electrically insulating material spaced apart from each other in a first direction and each of which segments extends longitudinally such that the isolation layer has a line and space pattern, and a plurality of the linear segments of the isolation layer have respective portions each of which extends longitudinally in the pad region of the device, and each said at least one pad layer covers all of the portions of the linear segments of the isolation layer that extend in the pad region of the device.

13. The semiconductor device according to claim 12, wherein the electrically conductive pad has opposite sides in the first direction, the opening is located closer to one of said opposite sides of the pad than the other, and each said at least one pad layer has an upper surface whose area is greater in the pad region than in the through electrode region.

14. The semiconductor device according to claim 13, wherein the through electrode region and the pad region are adjacent to each other and do not overlap each other.

15. The semiconductor device according to claim 13, wherein the through electrode region is surrounded by the pad region.

16. The semiconductor device according to claim 13, wherein the through electrode region is spaced apart from the pad region, and each said at least one pad layer has a necked in section, as viewed in plan, extending between the pad region and the through electrode region.

17. The semiconductor device according to claim 1, wherein the opening through each said at least one pad layer is circular so as to be circumscribed by the pad layer, and the through electrode passes through the semiconductor substrate in the through electrode region directly under the circular opening as vertically aligned therewith.

18. The semiconductor device according to claim 17, wherein the through electrode projects into the circular opening through each said at least one pad layer such that the at least one pad layer extends completely around the through electrode.

19. The semiconductor device according to claim 1, wherein the opening through each said at least one pad layer is semi-circular, and part of the through electrode passes through the semiconductor substrate in the through electrode region directly under the semi-circular opening.

20. The semiconductor device according to claim 19, wherein the through electrode projects into the semi-circular opening through each said at least pad layer such that the at least one pad layer extends partially around the through electrode.

* * * * *